(12) United States Patent
Nie et al.

(10) Patent No.: US 11,398,278 B2
(45) Date of Patent: Jul. 26, 2022

(54) NOR FLASH MEMORY CIRCUIT AND DATA WRITING METHOD

(71) Applicant: CHINA FLASH CO., LTD., Shanghai (CN)

(72) Inventors: Hong Nie, Shanghai (CN); Yue Zhao, Shanghai (CN)

(73) Assignee: CHINA FLASH CO., LTD., Shanghai (CN)

( * ) Notice: Subject to any disclaimer, the term of this patent is extended or adjusted under 35 U.S.C. 154(b) by 0 days.

(21) Appl. No.: 17/472,613

(22) Filed: Sep. 11, 2021

(65) Prior Publication Data
US 2022/0084602 A1  Mar. 17, 2022

(30) Foreign Application Priority Data

Sep. 11, 2020 (CN) .......................... 202010954320.6
Sep. 18, 2020 (CN) .......................... 202010986623.6

(51) Int. Cl.
| | |
|---|---|
| *G11C 11/34* | (2006.01) |
| *G11C 16/14* | (2006.01) |
| *G11C 16/30* | (2006.01) |
| *G11C 16/08* | (2006.01) |
| *G11C 16/26* | (2006.01) |
| *G11C 16/24* | (2006.01) |
| *G11C 16/10* | (2006.01) |

(52) U.S. Cl.
CPC .............. *G11C 16/14* (2013.01); *G11C 16/08* (2013.01); *G11C 16/102* (2013.01); *G11C 16/24* (2013.01); *G11C 16/26* (2013.01); *G11C 16/30* (2013.01)

(58) Field of Classification Search
CPC ......... G11C 16/10; G11C 16/30; G11C 16/12; G11C 16/0483; H01L 27/115
USPC .......................... 365/185.18, 189.16, 189.14
See application file for complete search history.

(56) References Cited

U.S. PATENT DOCUMENTS

| | | | |
|---|---|---|---|
| 7,768,837 B2* | 8/2010 | Choi ..................... | G11C 16/24 365/185.23 |
| 7,907,450 B2* | 3/2011 | Lue ................... | H01L 29/40117 365/185.11 |
| 10,269,440 B2 | 4/2019 | Guo et al. | |
| | (Continued) | | |

FOREIGN PATENT DOCUMENTS

| | | |
|---|---|---|
| CN | 102760490 A | 10/2012 |
| CN | 107017021 A | 8/2017 |
| CN | 108028061 A | 5/2018 |

*Primary Examiner* — Son T Dinh
(74) *Attorney, Agent, or Firm* — Global IP Services; Tianhua Gu (57) ABSTRACT

The present disclosure relates to a NOR flash memory circuit, a data writing method, a data reading method, and a data erasing method. The NOR flash memory circuit includes: a NOR memory array, a source voltage selection unit, a well voltage selection unit, a word line gating unit, a bit line gating unit, a data reading unit, and an analog voltage generating unit. During data writing, a source is floated, and a well electrode is connected to ground; and a first forward voltage is applied to a bit line where a memory cell to be written data into is located, and a second forward voltage is applied to a word line where the memory cell to be written data into is located. During data reading, a source is grounded, and well electrodes are grounded; and a third forward voltage is applied to a word line.

5 Claims, 7 Drawing Sheets

(56) References Cited

U.S. PATENT DOCUMENTS

2014/0050025 A1  2/2014  Tsao et al.
2015/0221375 A1  8/2015  Choi

\* cited by examiner

NOR FLASH MEMORY CIRCUIT AND DATA WRITING METHOD

CROSS REFERENCE TO RELATED APPLICATION

The present application claims the benefit of priority to Chinese Patent Application No. CN 2020109866236, entitled "NOR FLASH MEMORY CIRCUIT AND DATA WRITING, READING, ERASING METHOD", filed with CNIPA on Sep. 18, 2020, and Chinese Patent Application No. CN 2020109543206, entitled "NOR FLASH MEMORY CIRCUIT AND DATA WRITING, READING, ERASING METHOD", filed with CNIPA on Sep. 11, 2020, the disclosure of which is incorporated herein by reference in its entirety for all purposes.

TECHNICAL FIELD

The present disclosure relates to the field of memory, in particular, to a NOR flash memory circuit and a data writing method.

BACKGROUND

The rapid development and wide application of embedded structures and modern electronic devices (such as mobile electronic devices, in-vehicle electronic devices, and Internet electronic devices) indicate a strong demand for highly-integrated circuit chips. This in turn calls for smaller size in integrated circuit chips. In the field of memory, reducing the size of flash memory chips has always been the pursuit of manufacturers of large-capacity or even ultra-large-capacity flash memory chips.

Conventional NOR flash memory adopts hot carrier injection for writing data into the memory. Hot carrier injection refers to a physical process in which, when a bias voltage is applied to the drain of a memory cell and the source is grounded, high-energy hot electrons (>3.2 eV) are accelerated by a transverse electric field and generated in a channel of the memory cell, and then break through an energy barrier under gate-oxide high pressure to enter and to be stored in a floating gate of the memory cell. However, due to the restrictive conditions in the process to generate the hot electron injection, the drain and the source of the memory cell will be punched through if the channel is relatively short, which may hinder the effective data writing operations. That is, there is a limitation for a memory cell's effective channel length when it comes to hot carrier injection, which prevents effective reduction of the area of the memory cell.

Therefore, to overcome the punch-through of the drain and the source, and to reduce the device's size, improve efficiency, and reduce power consumption of the memory cell, have become an urgent challenge facing those skilled in the art.

SUMMARY

In view of the disadvantages in the conventional NOR flash memory, the present disclosure provides a NOR flash memory circuit and a data writing method, to solve the challenges in the prior art that the device's effective channel length cannot be reduced, its size is large, and its power consumption is high.

Thus, the present disclosure provides a NOR flash memory circuit, including: a NOR memory array, a source voltage selection unit, a well voltage selection unit, a word line gating unit, a bit line gating unit, a data reading unit, and an analog voltage generating unit.

The source voltage selection unit is connected to each source line of the NOR memory array, and is configured to set a source voltage of each memory cell in the NOR memory array.

The well voltage selection unit is connected to a well electrode of each memory cell in the NOR memory array, and is configured to set a well voltage of each memory cell.

The word line gating unit is connected to each word line of the NOR memory array, and is configured to gate each word line of the NOR memory array.

The bit line gating unit is connected to each bit line of the NOR memory array, and is configured to gate each bit line of the NOR memory array.

The data reading unit is connected to an output terminal of the bit line gating unit, and is configured to read data output by the bit line gating unit. and The analog voltage generating unit is connected to input terminals of the source voltage selection unit, the well voltage selection unit, the word line gating unit, the bit line gating unit, and the data reading unit, and is configured to generate a forward voltage and a reverse voltage to control the NOR memory array to perform data writing, reading, and erasing.

Optionally, the NOR memory array comprises m rows and n columns of memory cells. gates of memory cells in the same row are connected to the same word line. drains of memory cells in the same column are connected to the same bit line, sources of two adjacent columns of memory cells are connected to the same source line, and source lines are connected to the same signal. and m and n are natural numbers greater than 0.

In order to accomplish the above object and other related objects, the present disclosure provides a data writing method for NOR flash memory, which at least includes: floating the source of each memory cell in a NOR flash memory array, and connecting a well electrode to ground; gating a bit line where a memory cell for data to be written is located in the NOR flash memory array, and applying a first forward voltage to the bit line of the memory cell for data to be written; and gating a word line where the memory cell for data to be written is located, and applying a second forward voltage to the word line of the memory cell to be written data into, to achieve data writing.

Optionally, the first forward voltage is not less than 4 V.
Optionally, the second forward voltage is from 7 V to 12 V.

In order to accomplish the above object and other related objects, the present disclosure provides a data reading method for NOR flash memory. The data reading method for a NOR flash memory at least comprises:

connecting the source of each memory cell in a NOR flash memory array to ground, and connecting a well electrode to ground; gating a word line of a memory cell to be read data from in the NOR flash memory array, and applying a third forward voltage to the word line of the memory cell to be read data from, to gate the memory cell to be read data from; and gating a bit line where the memory cell to be read data from is located based on a fourth forward voltage, to output data in the memory cell to be read data from through the bit line where the memory cell to be read data from is located.

Optionally, the third forward voltage is a power supply voltage.

Optionally, the fourth forward voltage is from 1.2 V to 1.6 V.

In order to accomplish the above object and other related objects, the present disclosure provides a data erasing method for NOR flash memory. The data erasing method for a NOR flash memory at least comprises: applying a fifth forward voltage to a source and a well electrode of each memory cell in a NOR flash memory array; gating a bit line where a memory cell whose data is to be erased is located in the NOR flash memory array, and floating the bit line where the memory cell whose data is to be erased is located; and gating a word line where the memory cell whose data is to be erased is located, and applying a reverse voltage to the word line of the memory cell whose data is to be erased, to erase data in the memory cell whose data is to be erased.

Optionally, the fifth forward voltage is from 7 V to 12 V.

Optionally, the reverse voltage is from −7 V to −12 V.

As described above, the NOR flash memory circuit and the data writing method according to the present disclosure have the following beneficial effects:

The NOR flash memory circuit and the data writing method according to the present disclosure provide effective and convenient operational support for data reading, writing, and erasing by improving and optimizing operation procedures, so that the effective channel length of the memory cell can be reduced, thereby reducing the area of the memory, with improved efficiency and reduced power consumption.

REFERENCE NUMERALS

1 NOR flash memory circuit
11 NOR memory array
12 Source voltage selection unit
13 Well voltage selection unit
14 Word line gating unit
15 Bit line gating unit
16 Data reading unit
17 Analog voltage generating unit

DETAILED DESCRIPTION

The following describes implementations of the present disclosure through specific embodiments. A person skilled in the art may easily understand other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

Reference is made to FIG. 1 to FIG. 7. It should be noted that the drawings provided in this embodiment exemplify the basic idea of the present disclosure. Therefore, some of the components related to the present disclosure are shown in the drawings, and are not drawn according to the quantities, shapes, and sizes of the components during actual implementation. During actual implementation, the types, quantities, and proportions of the components may be randomly changed, and the layout of the components may be more complex.

Embodiment 1

Figure 1:
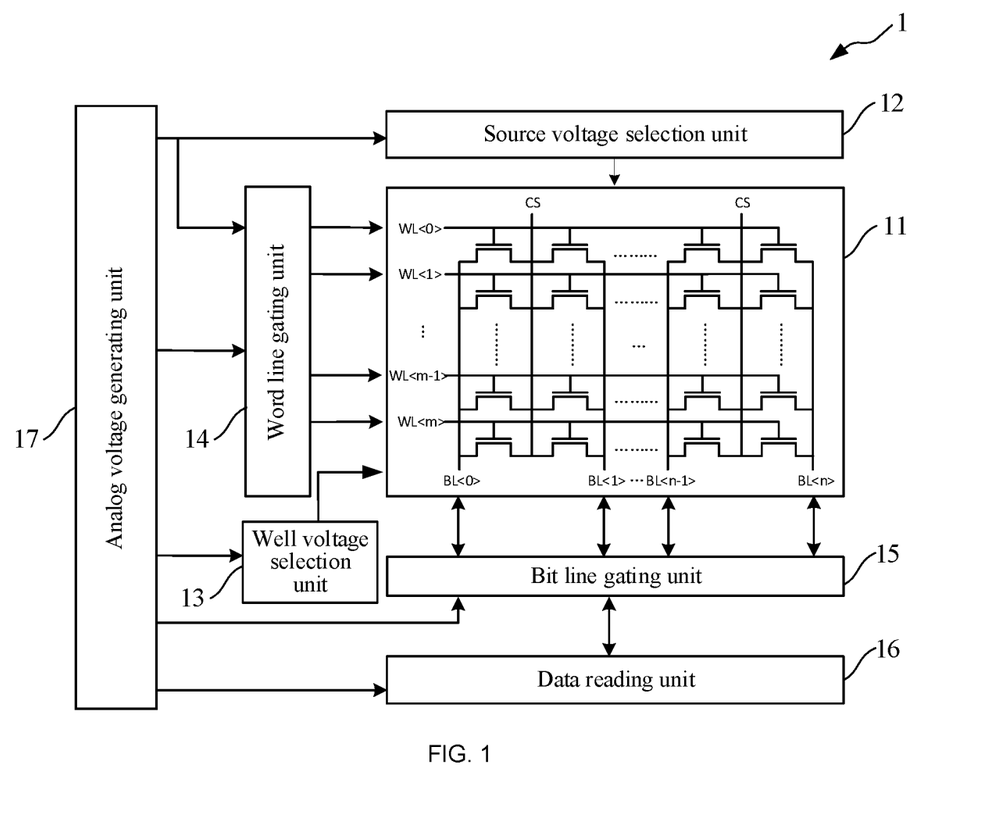
FIG. 1 is a schematic structural diagram of a NOR flash memory circuit according to the present disclosure.

As shown in FIG. 1, the present disclosure provides a NOR flash memory circuit 1. The NOR flash memory circuit 1 includes, among other components, a NOR memory array 11, a source voltage selection unit 12, a well voltage selection unit 13, a word line gating unit 14, a bit line gating unit 15, a data reading unit 16, and an analog voltage generating unit 17.

As shown in FIG. 1, the NOR memory array 11 comprises m rows and n columns of memory cells, and m and n are natural numbers greater than 0. Specifically, in the NOR memory array 11, gates of memory cells in the same row are connected to the same word line; drains of memory cells in the same column are connected to the same bit line, sources of two adjacent columns of memory cells are connected to the same source line, and source lines are connected to the same signal. In this embodiment, word lines in different rows are defined from top to bottom as WL<0>, WL<1>, ..., WL<m−1>, and WL<m>, bit lines in different columns are defined from left to right as BL<0>, BL<1>, ..., BL<n−1>, and BL<n>, and the source line connected to each memory cell is connected to a source voltage CS.

As shown in FIG. 1, the source voltage selection unit 12 is connected to a source line of the NOR memory array 11, and is used to configure the source voltage CS of each memory cell in the NOR memory array 11. Specifically, the source voltage selection unit 12 obtains an analog voltage from the analog voltage generating unit 17 to configure the source voltage CS of each memory cell.

As shown in FIG. 1, the well voltage selection unit 13 is connected to a well electrode of each memory cell in the NOR memory array 11, and is configured to configure a well voltage of each memory cell. Specifically, the well voltage selection unit 13 obtains an analog voltage from the analog voltage generating unit 17 to configure the well voltage of each memory cell.

As shown in FIG. 1, the word line gating unit 14 is connected to each word line of the NOR memory array 11, and is configured to gate each word line of the NOR memory array 11. Specifically, the word line gating unit 14 obtains an analog voltage from the analog voltage generating unit 17 to gate a word line of the NOR memory array 11 that needs to be operated, and transmit a word line voltage to the corresponding word line.

As shown in FIG. 1, the bit line gating unit 15 is connected to each bit line of the NOR memory array 11, and is configured to gate each bit line of the NOR memory array 11. Specifically, the bit line gating unit 15 obtains an analog voltage from the analog voltage generating unit 17 to gate a bit line of the NOR memory array 11 that needs to be operated.

As shown in FIG. 1, the data reading unit 16 is connected to an output terminal of the bit line gating unit 15, and is configured to read data output by the bit line gating unit 15. Specifically, the data reading unit 16 obtains an analog voltage from the analog voltage generating unit 17, and performs read amplification on data output from a bit line selected by the bit line gating unit 15, and the read amplification comprises, but is not limited to, outputting a comparison result as a readout signal after comparing the output data with a reference voltage.

As shown in FIG. 1, the analog voltage generating unit 17 is connected to input terminals of the source voltage selection unit 12, the well voltage selection unit 13, the word line gating unit 14, the bit line gating unit 15, and the data reading unit 16, and is configured to generate a forward voltage and a reverse voltage to control the NOR memory array 11 to perform data writing, reading, and erasing.

Embodiment 2

Figure 2:
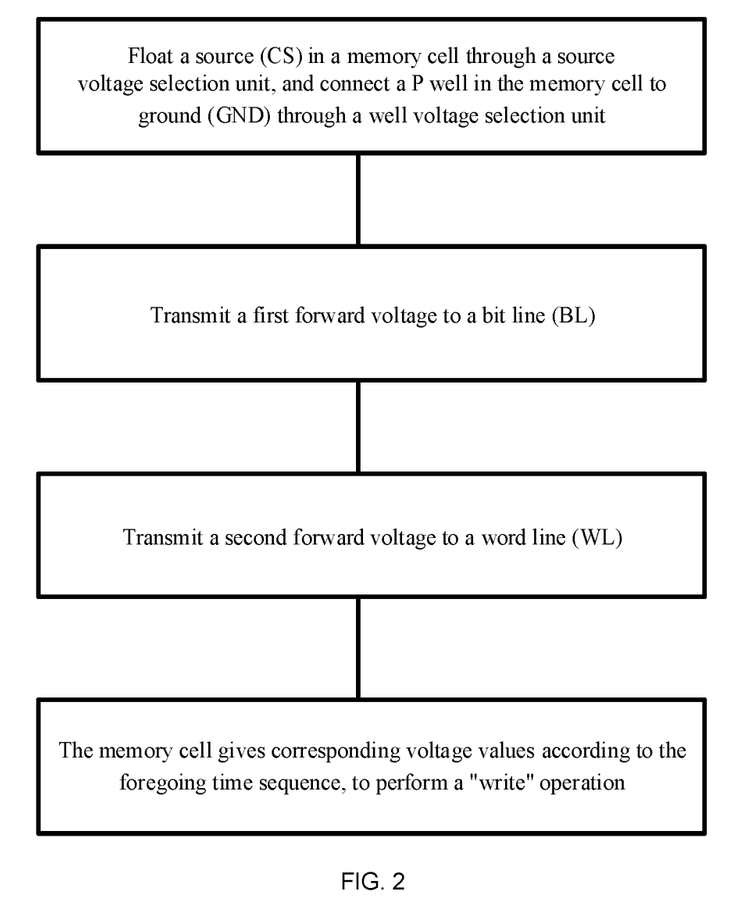
FIG. 2 is a schematic flowchart of a data writing method for a NOR flash memory according to the present disclosure.
Figure 3:
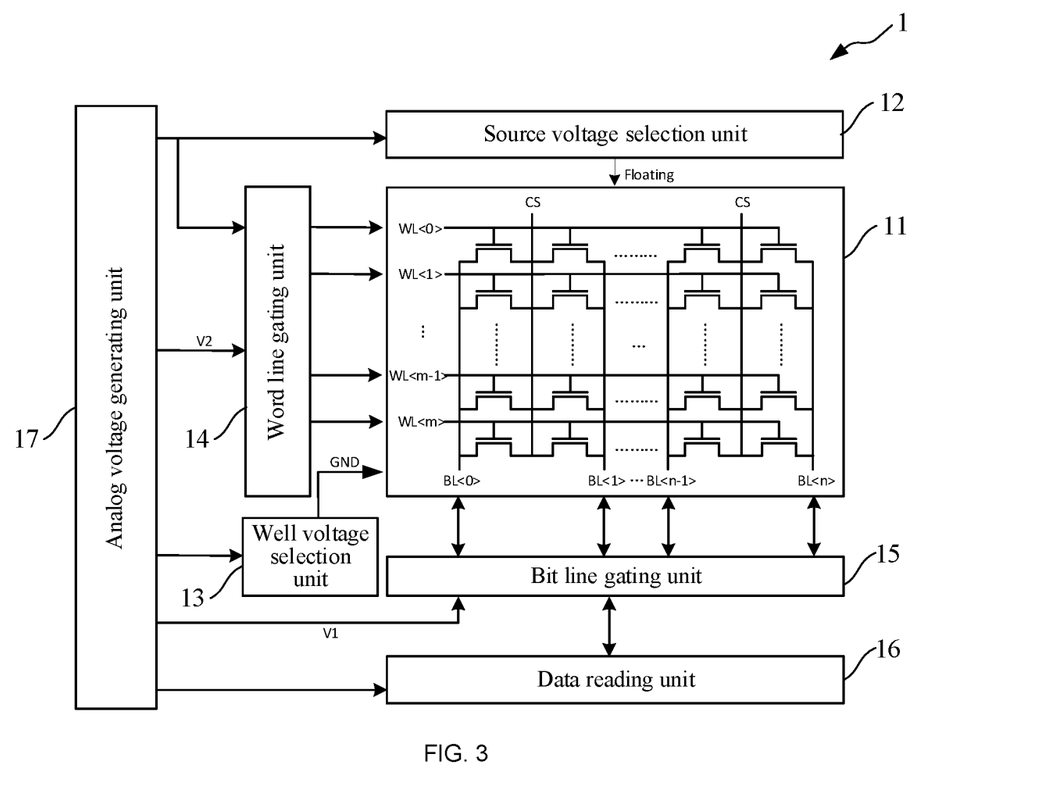
FIG. 3 is a schematic diagram illustrating the operation of writing data by a NOR flash memory circuit according to the present disclosure.

As shown in FIG. 2 and FIG. 3, the present disclosure provides a data writing method for NOR flash memory. The data writing method for NOR flash memory comprises the following Operations:

First operation: Float the source of each memory cell in a NOR flash memory array, and ground well electrodes.

Second operation: gate a bit line in the NOR flash memory array where a memory cell into which data is to be written is located, and apply a first forward voltage V1 to the bit line of the memory cell to be written data into.

Third operation: gate a word line where the memory cell to be written data into is located, and apply a second forward voltage V2 to the word line of the memory cell to be written data into, to achieve data writing. The first forward voltage V1 is not less than 4 V (including, but not limited to, 4.3 V, 5 V, 6 V, and 7 V), and the second forward voltage V2 is from about 7 V to about 12 V.

In an example, as shown in FIG. 2 and FIG. 3, in this embodiment, the data writing method for NOR flash memory is implemented based on the NOR flash memory circuit 1 of Embodiment 1. When a "write" operation is performed, according to a preset rule, first, the source (CS) of each memory cell in the NOR memory array 11 is floated based on the source voltage selection unit 12, and the well electrode (P well) of each memory cell is connected to ground (GND) through the well voltage selection unit 13; then, the first forward voltage V1 generated by the analog voltage generating unit 17 is transmitted to a corresponding bit line based on the bit line gating unit 15; and finally, the second forward voltage V2 generated by the analog voltage generating unit 17 is transmitted to a corresponding word line based on the word line gating unit 14. The memory cell produces corresponding voltage values according to the foregoing time sequence, which may perform and complete a "write" operation into the memory cell.

When the "write" operation is performed, the source of the memory cell to be written data into is floated, the well electrode is grounded, and the first forward voltage V1 is applied to the drain. In this case, a lateral electric field is generated in the memory cell to be written data into, and electron-hole pairs are generated, which in turn generate primary electrons, and the primary electrons move toward the drain.

The primary electrons collide with a side wall of a drain region to accelerate holes downward, and then collide with a substrate of the memory cell to be written data into, and then generate secondary electrons. The second forward voltage V2 is applied to a gate of the memory cell to be written data into, so that the secondary electrons generate tertiary electrons under the action of a vertical electric field to inject the tertiary electrons into a floating gate of the memory cell, thereby performing and completing a programming operation.

Embodiment 3

Figure 4:
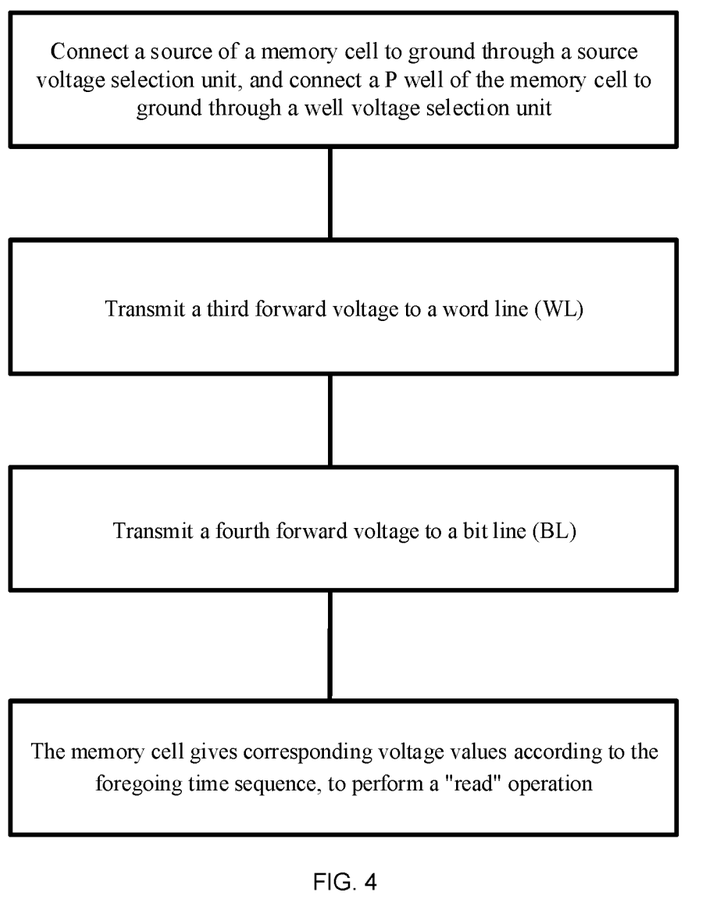
FIG. 4 is a schematic flowchart of a data reading method for a NOR flash memory according to the present disclosure.
Figure 5:
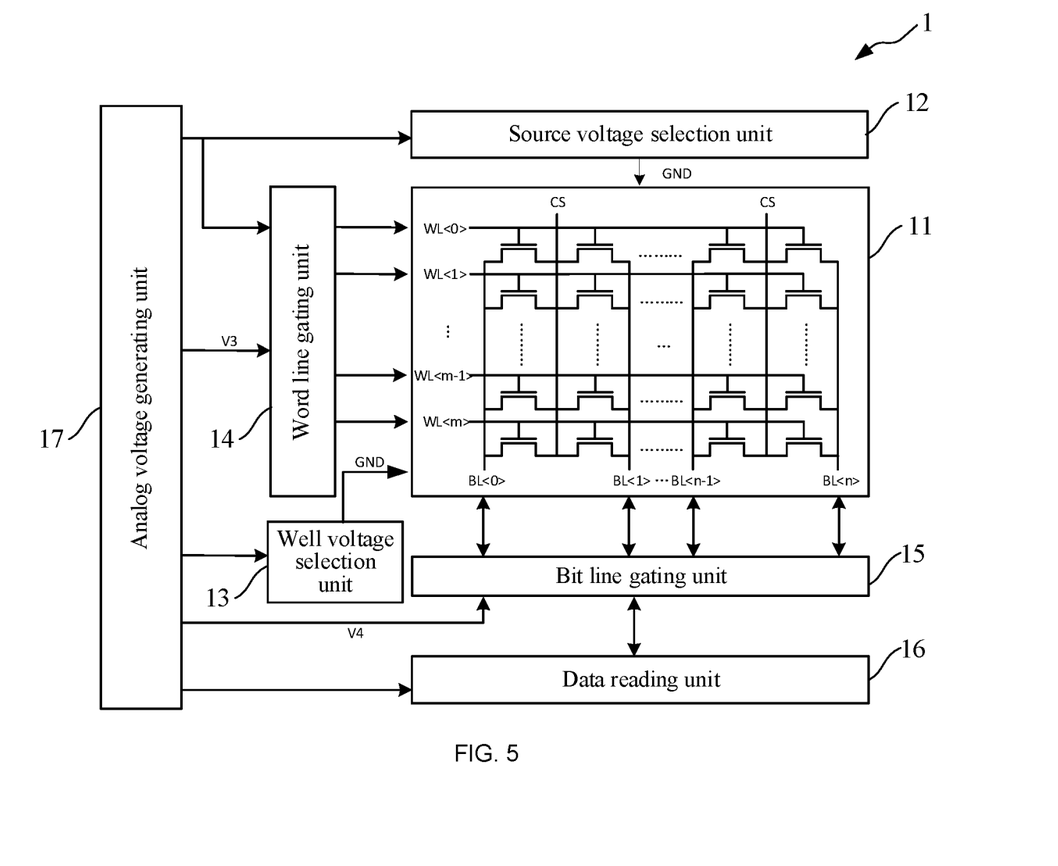
FIG. 5 is a schematic diagram illustrating the operation of reading data by a NOR flash memory circuit according to the present disclosure.

As shown in FIG. 4 and FIG. 5, the present disclosure provides a data reading method for NOR flash memory, including the following operations:

First operation: connect the source of each memory cell in a NOR flash memory array to ground (GND), and connect well electrodes to ground (GND).

Second operation: gate a word line of a memory cell 11 (from which data is to be read) in the NOR flash memory array, and apply a third forward voltage V3 to the word line of the memory cell 11 from which data is to be read, in order to gate this memory cell 11 to be read data from.

Third operation: gate a bit line where the memory cell to be read data from is located, based on a fourth forward voltage V4, in order to output the data stored in this memory cell though the bit line where this memory cell is located. In this embodiment, the third forward voltage V3 is set as the power supply voltage, or set to any voltage value that can turn on the memory cell is applicable to the present disclosure, without limitation. The fourth forward voltage V4 is from about 1.2 V to about 1.6 V.

In an embodiment, as shown in FIG. 4 and FIG. 5, the data reading method for NOR flash memory is implemented based on the NOR flash memory circuit 1 of Embodiment 1. When a "read" operation is performed, according to a preset rule, first, the source (CS) of each memory cell in the NOR memory array 11 is connected to ground (GND) based on the source voltage selection unit 12, and the well electrode (P well) of each memory cell is connected to ground (GND) through the well voltage selection unit 13.

Afterward, the third forward voltage V3 generated by the analog voltage generating unit 17 is transmitted to a corresponding bit line based on the bit line gating unit 15, and the word line gating unit 14 gates a corresponding word line based on the fourth forward voltage V4 generated by the analog voltage generating unit 17. The memory cell produces corresponding voltage values according to the foregoing time sequence, in order to perform and complete the "read" operation.

Embodiment 4

Figure 6:
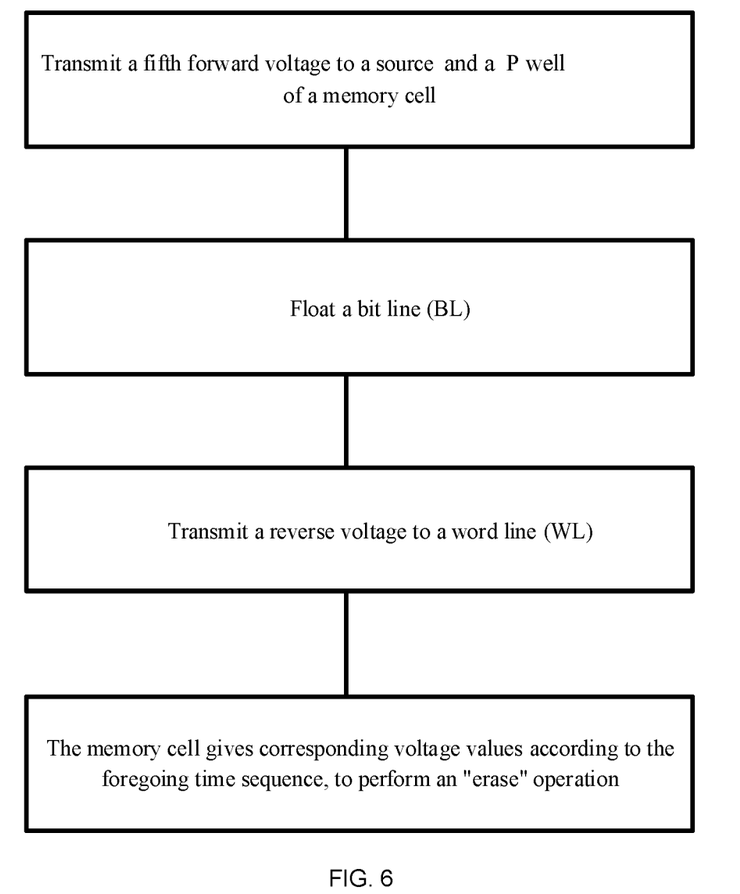
FIG. 6 is a schematic flowchart of a data erasing method for a NOR flash memory according to the present disclosure.
Figure 7:
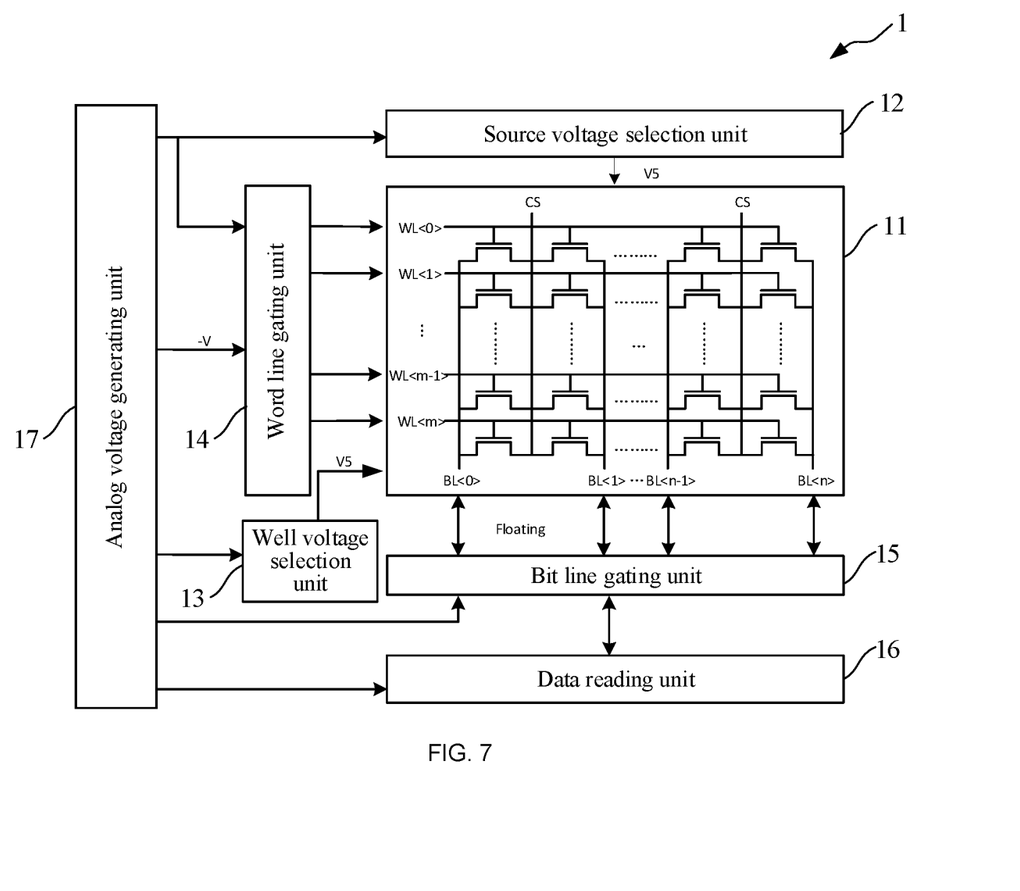
FIG. 7 is a schematic diagram illustrating the operation of erasing data by a NOR flash memory circuit according to the present disclosure.

As shown in FIG. 6 and FIG. 7, the present disclosure provides a data erasing method for NOR flash memory, which includes the following operations:

First operation: apply a fifth forward voltage V5 to a source and a well electrode of each memory cell in a NOR flash memory array 11.

Second operation: float a bit line where a memory cell whose data is to be erased is located in the NOR flash memory array 11.

Third operation: gate a word line where the memory cell (from which data is to be erased) is located, and apply a reverse voltage −V to the word line of this memory cell, in order to erase data in this memory cell. In this embodiment, the fifth forward voltage V5 is from about 7 V to about 12 V, and the reverse voltage −V is from about −7 V to about −12 V.

In an embodiment, as shown in FIG. 6 and FIG. 7, the data erasing method for NOR flash memory is implemented based on the NOR flash memory circuit 1 of Embodiment 1. When an "erase" operation is performed, according to a preset rule, first, the fifth forward voltage V5 generated by the analog voltage generating unit 17 is transmitted to the source and the well electrode through the source voltage selection unit 12 and the well voltage selection unit 13; then, the bit line in the NOR memory array 11 where the memory cell with the to-be-erased data is located is floated based on the bit line gating unit 15; and finally, the reverse voltage −V generated by the analog voltage generating unit 17 is transmitted to a corresponding word line based on the word line gating unit 14. The memory cell produces corresponding voltage values according to the foregoing time sequence, in order to perform and complete the "erase" operation.

In the present disclosure, based on tertiary electron collision, lateral and vertical electric fields are simultaneously formed. The memory cell's effective channel length can be reduced, the memory's area can be reduced, its efficiency can be improved, and its power consumption can be reduced.

In summary, the present disclosure provides a NOR flash memory circuit is and a data writing method. The NOR flash memory circuit comprises: a NOR memory array, a source voltage selection unit, a well voltage selection unit, a word line gating unit, a bit line gating unit, a data reading unit, and an analog voltage generating unit. During data writing, the source of each memory cell in a NOR flash memory array is floated, and a well electrode is connected to ground; a bit line, where the memory cell into which data is to be written is located in the NOR flash memory array, is gated, and a first forward voltage is applied to the bit line of the memory cell to be written data into; and a word line, where the memory cell to be written data into is located, is gated, and a second forward voltage is applied to the word line of the memory cell to be written data into, in order to perform data writing.

During data reading, the source of each memory cell in a NOR flash memory array is connected to ground, and a well electrode is connected to ground; a word line of a memory cell from which data is to be read in the NOR flash memory array is gated, and a third forward voltage is applied to the word line of the memory cell to be read data from, to gate the memory cell to be read data from; and a bit line, where the memory cell to be read data from is located, is gated based on a fourth forward voltage, to output data in the memory cell to be read data from, through the bit line where the memory cell to be read data from is located.

During data erasing, a fifth forward voltage is applied to a source and a well electrode of each memory cell in a NOR flash memory array; a bit line in the NOR flash memory array, where a memory cell whose data is to be erased is located, is gated; the bit line, where the memory cell whose data is to be erased is located, is floated; a word line, where the memory cell whose data is to be erased is located is gated, and a reverse voltage is applied to the word line of the memory cell whose data is to be erased, to erase data in the memory cell.

The NOR flash memory circuit and the data writing method according to the present disclosure provide effective and convenient operational support for data reading, writing, and erasing by improving and optimizing operation procedures, so that the effective channel length of the memory cell can be reduced, thereby reducing the area of the memory, with the efficiency improved and the power consumption reduced. Therefore, the present disclosure effectively overcomes various shortcomings in the prior art, and has a high industrial value.

The foregoing embodiments merely exemplify the principles and effects of the present disclosure, but are not intended to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A data writing method for NOR flash memory, the data writing method comprises:
   floating the source of each memory cell in a NOR flash memory array, and connecting a well electrode to ground;
   gating a bit line in the NOR flash memory array, wherein a memory cell into which data is to be written is located at the bit line;
   applying a first forward voltage to the bit line, so that electron-hole pairs are generated in the memory cell and primary electrons are generated, wherein the bit line is connected to a drain of the memory cell, wherein the electron-hole pairs comprises the primary electrons and holes, wherein
   the primary electrons move toward the drain of the memory cell and collide with a side wall of a drain region of the memory cell and the holes accelerate downward, and
   the holes collide with a substrate of the memory cell to generate secondary electrons;
   gating a word line where the memory cell is located; and
   removing the first forward voltage applied to the bit line, and applying a second forward voltage to the word line of the memory cell, wherein the word line of the memory cell is connected to a gate of the memory cell, so that the secondary electrons generate tertiary electrons under the action of a vertical electric field to inject the tertiary electrons into a floating gate of the memory cell, in order to achieve data writing.

2. The data writing method for NOR flash memory as in claim 1, wherein the first forward voltage is not less than 4 V.

3. The data writing method for NOR flash memory as in claim 1, wherein the second forward voltage is from 7 V to 12 V.

4. A NOR flash memory circuit, configured to implement a data writing method, wherein the NOR flash memory circuit comprises:
   a NOR memory array, a source voltage selection unit, a well voltage selection unit, a word line gating unit, a bit line gating unit, a data reading unit, and an analog voltage generating unit, wherein
   the source voltage selection unit is connected to source lines of the NOR memory array, and is used to configure a source voltage of each memory cell in the NOR memory array;
   the well voltage selection unit is connected to a well electrode of each memory cell in the NOR memory array, and is used to configure a well voltage of each memory cell;
   the word line gating unit is connected to each word line of the NOR memory array, and is configured to gate each word line of the NOR memory array;

the bit line gating unit is connected to each bit line of the NOR memory array, and is configured to gate each bit line of the NOR memory array;

the data reading unit is connected to an output terminal of the bit line gating unit, and is configured to read data output by the bit line gating unit; and the analog voltage generating unit is connected to input terminals of the source voltage selection unit, the well voltage selection unit, the word line gating unit, the bit line gating unit, and the data reading unit, and is configured to generate a forward voltage and a reverse voltage to control the NOR memory array to perform data writing, and wherein the data writing method for NOR flash memory comprises:

floating the source of each memory cell in a NOR flash memory array, and connecting a well electrode to ground;

gating a bit line in the NOR flash memory array, wherein a memory cell to be written data into is located at the bit line;

applying a first forward voltage to the bit line;

gating a word line where the memory cell to be written data into is located; and applying a second forward voltage to the word line of the memory cell to be written data into to achieve data writing.

5. The NOR flash memory circuit as in claim 4, wherein the NOR memory array comprises m rows and n columns of memory cells, and m and n are natural numbers greater than 0, gates of memory cells in the same row are connected to the same word line, drains of memory cells in the same column are connected to the same bit line, sources of two adjacent columns of memory cells are connected to the same source line, and source lines are connected to a same signal.

* * * * *